(12) United States Patent
Yamanashi

(10) Patent No.: US 6,232,746 B1
(45) Date of Patent: May 15, 2001

(54) BATTERY CHARGING APPARATUS AND FULL-CHARGING DETECTING METHOD

(75) Inventor: Hidenori Yamanashi, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/610,366

(22) Filed: Jul. 5, 2000

(30) Foreign Application Priority Data

Jul. 5, 1999 (JP) .................................................. 11-189976

(51) Int. Cl.[7] ............................ H02J 7/00; G01N 27/416
(52) U.S. Cl. ...................................... 320/132; 324/430
(58) Field of Search ................................ 320/161, 162, 320/132; 324/430

(56) References Cited

U.S. PATENT DOCUMENTS

| | | | |
|---|---|---|---|
| 5,193,067 | * | 3/1993 | Sato et al. ............................... 702/62 |
| 5,574,355 | * | 11/1996 | McShane et al. .................... 320/161 |
| 5,642,031 | * | 6/1997 | Brotto ................................. 320/156 |
| 6,072,299 | * | 6/2000 | Kurle et al. .......................... 320/112 |
| 6,144,838 | * | 9/2000 | Brink et al. .......................... 320/136 |

FOREIGN PATENT DOCUMENTS 9-158769 * 6/1997 (JP) .

* cited by examiner

*Primary Examiner*—Edward H. Tso
*Assistant Examiner*—Gregory J Toatley, Jr.
(74) *Attorney, Agent, or Firm*—Finnegan, Henderson, Farabow, Garrett & Dunner, L.L.P.

(57) ABSTRACT

A battery charging apparatus 1 includes a full-charging detecting system 11. While a battery is charged, the full-charging detecting system operates as follows. A charging current supplied from an DC power source is detected. The internal impedance is computed on the basis of the charging current thus detected and charging voltage of the DC power source. The full-charging of the battery is detected on the basis of the comparison between the internal impedance thus computed and a prescribed value. In this configuration, even when the full-charging capacity varies owing to the degradation of the battery, the full-charged state of the battery can be detected precisely.

12 Claims, 6 Drawing Sheets

BATTERY CHARGING APPARATUS AND FULL-CHARGING DETECTING METHOD

BACKGROUND OF THE INVENTION

1. Field of the Invention

The present invention relates to a battery charging apparatus and full-charging detecting method, and more particularly to a battery charging apparatus including a full-charging detecting means for detecting the full-charged state of a battery and a method of detecting the full-charged state of the battery.

2. Description of the Related Art

Generally, the battery such as a battery loaded in a vehicle (hereinafter referred to as "in-vehicle battery" will suffer degradation if charging therefor is continued in its full-charged state (remaining level of 100% of the battery). Therefore, in order to prevent the degradation of the battery due to excess charging, it is necessary to detect the full-charged state so that warning informing the full-charged state can be issued, or charging can be automatically stopped.

In order to realize this, a charging/discharging circuit has been proposed in which a battery charging device is built as shown in FIG. 7.

In FIG. 7, a battery charging device 1 includes an AC/DC converter 10 (AC/DC converting means) serving as a DC power source, and a full-charging detecting device 11 serving as a full-charging detecting means. The full-charging detecting device includes a current sensor 101, a voltage sensor 102 and a microcomputer 103.

While the in-vehicle battery is charged, the AC/DC converter 10 converts the AC voltage source from an alternator (not shown) into a DC voltage, and also supplies a charging current Ic to the battery B. The charging current Ic is also supplied to the current sensor 101 connected in series with the battery B.
On the other hand, while the in-vehicle battery B is discharged, a discharging current Io discharged from the in-vehicle battery B is supplied to a load 12 and also to the current sensor 101.

The current sensor 101 detects the charging current Ic supplied to the battery B and the discharging current Io produced therefrom, and supplies the detected values to the microcomputer 103. The microcomputer 103 is also supplied with the detected value of the terminal voltage across the battery B (hereinafter referred to as a terminal voltage VB) which is detected by the voltage sensor 102 connected in parallel to the in-vehicle battery B.

The microcomputer 103 includes a CPU 103a which is operated in accordance with a prescribed control program, an ROM 103b which stores the control program for the CPU 103a and a prescribed full-charging level, and a RAM 103c which temporarily stores the data necessary to perform the computation in the CPU 103a.

An explanation will be given of the operation of the charging/discharging circuit incorporating the battery charging device 1 having the configuration described above. While the in-vehicle battery B is charged, the CPU 103a successively captures the charging current Ic detected by the current sensor 101 and the terminal voltage VB detected by the voltage sensor 102 to compute an electric power (=Ic× VB) and detects an accumulated value of the electric power thus computed as a remaining level. On the other hand, while the battery B is discharged, the CPU 103a successively captures the discharging current Ic detected by the current sensor 101 and the terminal voltage VB detected by the voltage sensor 102 and computes an electric power (=Io×VB) on the basis of.them and subtracts an accumulated value of the electric power thus computed from the remaining level.

The CPU 103a successively detects the remaining capacity of the in vehicle battery B by the above accumulation system. When the detected remaining capacity exceeds the prescribed full-charged capacity held in the ROM 103b, the CPU 103a detects that the battery B has reached the full-charged state, and supplies a charging stopping signal Sl to the AC/DC converter 10. At this time, the AC/DC converter 10 stops supply of the charging current Ic to the battery B.

In short, when the in-vehicle battery B reaches the full-charged state, the AC/DC converter 10 stops to supply the charging current. Thus, the degradation of the battery B due to excess charging can be prevented.

Meanwhile, generally, the in-vehicle battery has a characteristic that it will gradually suffers degradation while the charging/discharging therefor is repeated. Particularly, a Ni-family battery that has been generally used as a battery for an electric vehicle has a great change in the full-charging capacity due to the degradation.

However, when the detected remaining capacity exceeds the prescribed full-charging capacity, the charging/discharging circuit incorporating the conventional battery charging device detects the full-charged state of the battery and simultaneously stops the charging. Therefore, if the actual full-charging capacity of the battery lowers owing to the degradation, the prescribed full-charging capacity becomes larger than the actual full-charging capacity so that the full-charged state of the battery cannot be detected accurately. As a result, when the battery suffers degradation, although the battery has already been fallen in the full-charged state, the remaining capacity in the full-charged sate does not exceed the prescribed full-charging capacity and the charging for the battery is continued. This leads to further degradation of the battery.

Meanwhile, the progression of degradation of the battery is proportional to the using period of the battery. Therefore, in order to obviate the above disadvantage, it can be proposed to form the map data of a plurality of full-charged capacities corresponding to the using period, which are to be used according to the using period. However, this proposal, which requires a memory having a large capacity enough to store a plurality of full-charging capacities, is problematic in terms of cost.

Further, the full-charging capacity of the battery changes with a change in the battery temperature. Specifically, as the battery temperature falls, the full-charging capacity decreases, whereas as the battery temperature rises, the full-charging capacity increases. Therefore, in the conventional battery charging apparatus, the actual full-charging capacity changes according to the battery temperature and hence becomes different from the prescribed full-charging capacity so that the full-charged state of the battery cannot be detected accurately.

Where the battery is successively used in an environment at a high temperature, the actual full-charging capacity increases with a rise in the battery temperature. As a result, although the battery has not been fully charged, the remaining capacity exceeds the prescribed full-charging capacity. Thus, the charging for the battery is stopped since the prescribed full-charging capacity<actual full-charging capacity). On the other hand, where the battery is successively used in the environment at a low temperature, the actual full-charging capacity decreases with a fall in the battery temperature. As a result, although the battery has been already fully charged, the remaining capacity does not exceed the prescribed full-charging capacity. Thus, the charging for the battery is continued by the DC power source since the prescribed full-charging capacity>actual full-charging capacity. This promotes the degradation of the battery.

As described above, the full-charging capacity changes with both the progress of degradation and the temperature of the battery. Therefore, in order to compensate for such changes, it is necessary to measure the using period of the battery and the temperature thereof and acquire the full-charging capacity on the basis of these measured values. This requires complicated control and computation.

SUMMARY OF THE INVENTION

A first object of the invention is to provide a battery charging apparatus which can accurately detect the full-charged state of a battery when it changes owing to degradation of the battery and a method for accurately detecting the full-charged state of the battery using this apparatus.

A first object of the invention is to provide a battery charging apparatus which can accurately detect the full-charged state of a battery when it changes owing to degradation and temperature change of the battery and a method for accurately detecting the full-charged state of the battery using this apparatus.

In order to attain the first object, in accordance with the invention, as shown in FIG. 1, there is provided a battery charging apparatus including full-charging detecting means 11 for detecting a full-charged state of a battery B, wherein the full-charging detecting means comprises: charging current detecting means 101 for detecting a charging current supplied from a DC power source 10 while the battery is charged with a constant voltage; and internal-impedance computing means 105a-1 for computing an internal impedance on the basis of a charging voltage of the DC power source and the charging current detected by the charging current detecting means, wherein the internal impedance computed by the internal impedance computing means is compared with a prescribed value to detect the full-charged state.

When the battery is in the full-charged state, the internal impedance does not change dependently on its degradation. Therefore, by comparing the internal impedance and the prescribed value, the full-charged state of the battery can be precisely detected even when the full-charging capacity changes dependently of the degradation of the battery.

In the invention described above, preferably, the prescribed value is smaller than the internal impedance when the battery has been fully charged, and the full-charging detecting means detects the full-charging when the computed internal impedance exceeds the prescribed value.

In this configuration, as long as the internal impedance when the battery has been actually fully charged is not smaller the prescribed value owing to a change in the battery temperature, the full-charged state of the battery can be surely detected.

Preferably, where the battery is subjected to boost charging with a constant voltage that is higher than a voltage across the battery, the prescribed value is set at a value equal to the internal impedance of the battery, and the full-charging detecting means detects the full-charging when the computed internal impedance is equal to the prescribed value. In this configuration, in the state close to the full-charging, the internal impedance RB1 becomes equal to the internal impedance when the battery has been fully charged and does not further vary. Therefore, the full-charging may be detected when the computed internal impedance is equal to the prescribed value so that the full-charging can be detected in the state more close to the full-charged state.

In order to attain the second object, in accordance with the invention, there is provided a battery charging apparatus including full-charging detecting means for detecting a full-charged state of a battery, wherein the full-charging detecting means comprises: charging current detecting means for detecting a charging current supplied from a DC power source while the battery is charged with a constant voltage; and internal-impedance computing means for sequentially computing an internal impedance on the basis of a charging voltage of the DC power source and the charging current detected by the charging current detecting means, wherein the full-charging is detected when there is no variation on the basis of the internal impedance computed by the internal impedance computing means.

In this configuration, the internal impedance of the battery when it has been fully charged necessarily becomes constant irrespectively of the degradation or the temperature of the in-vehicle battery. Therefore, the full-charging is detected when there is no variation in the internal impedance of the battery on the basis of the internal impedance of the battery sequentially computed by the internal impedance computing means. Thus, even when the full-charging capacity varies owing to the degradation or temperature change of the battery, the full-charged state of the battery can be detected precisely.

Preferably, the battery charging apparatus further comprises charging stopping means for stopping supply of the charging current to the battery when the full-charging is detected by the full-charging detecting means. In this configuration, charging can be automatically stopped when the battery has been fully charged, thereby preventing excess charging.

Preferably, the battery is an in-vehicle battery, the DC power source is an AC/DC converter for converting an AC current from an alternator into a DC current, and when the full-charging is detected by the full-charging detecting means, supply of the charging current from the AC/DC converting means to the in-vehicle battery is stopped. This configuration prevents the degradation of the in-vehicle battery due to excess charging to assure the stable running of the vehicle.

Preferably, the battery charging apparatus further comprising:
warning generating means for generating warning when the full-charging is detected.

In this configuration, a user can know from the warning from the warning generating means that the battery has been fully charged. Therefore, the user stops the charging of the battery to prevent its excess charging.

In accordance with the invention, there is provided a method of detecting full-charging of a battery comprising the steps of: detecting a charging current supplied from a DC power source to a battery while the battery is charged with a constant voltage; computing an internal impedance of the battery on the basis of a charging voltage of the DC power source and the charging current; and comparing the internal impedance with a prescribed value to detect the full-charging of the battery.

When the battery is in the full-charged state, the internal impedance does not change dependently on its degradation. Therefore, by comparing the internal impedance and the prescribed value to detect the full-charging, the full-charged state of the battery can be precisely detected even when the full-charging capacity changes dependently of the degradation of the battery.

In accordance with the invention, there is provided a method of detecting full-charging of a battery comprising the steps of: detecting a charging current supplied from a DC power source to a battery while the battery is charged with a constant voltage; sequentially computing an internal impedance of the battery on the basis of a charging voltage of the DC power source and the charging current; and detecting the full-charging when there is no variation in the internal impedance.

In this configuration, the internal impedance of the battery when it has been fully charged necessarily becomes constant irrespectively of the degradation or the temperature of the in-vehicle battery. Therefore, the full-charging is detected when there is no variation in the internal impedance of the battery on the basis of the internal impedance of the battery sequentially computed by the internal impedance computing means. Thus, even when the full-charging capacity varies owing to the degradation or temperature change of the battery, the full-charged state of the battery can be detected precisely.

The above and other objects and features of the invention will be more apparent from the following description taken in conjunction with the accompanying drawings.

DESCRIPTION OF THE PREFERRED EMBODIMENTS

Figure 1:
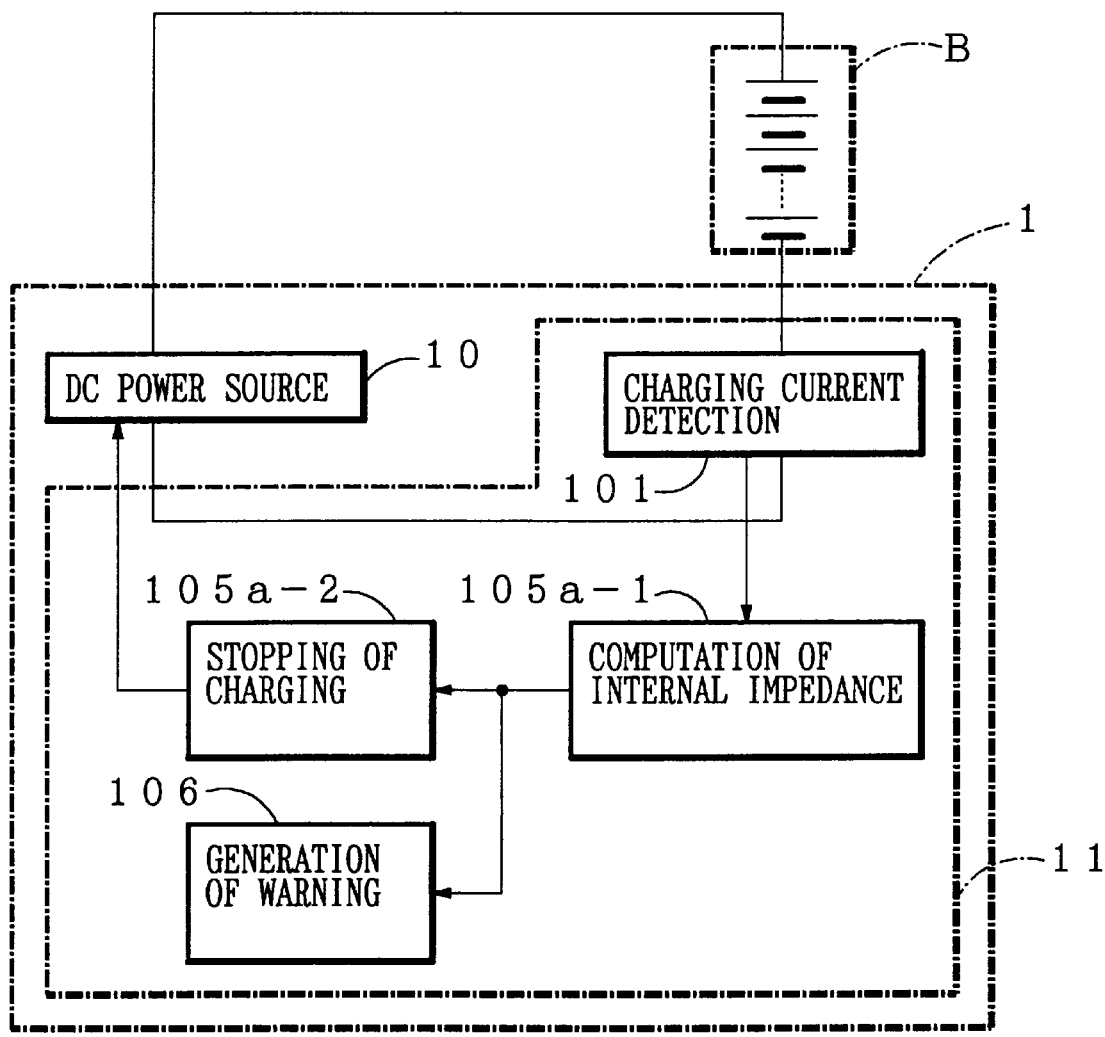
FIG. 1 is a block diagram showing a basic configuration of a charging/discharging circuit incorporating a battery charging apparatus according to the invention.

Now referring to the drawings, an explanation will be given of various embodiments of a battery charging apparatus according to the invention.

Embodiment 1

Figure 2:
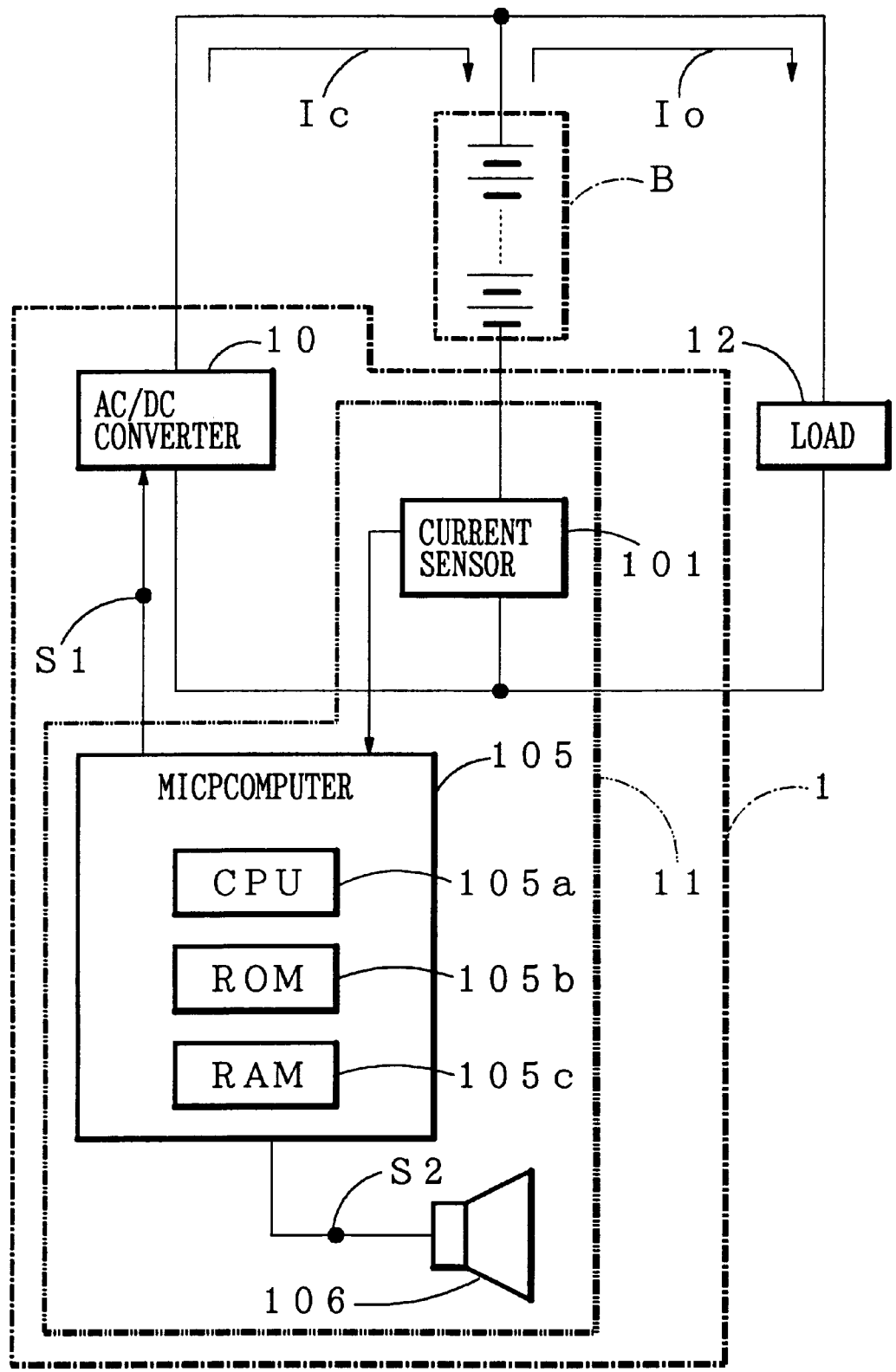
FIG. 2 is a circuit diagram of an embodiment of the charging/discharging circuit incorporating the battery charging apparatus according to the invention.
Figure 7:
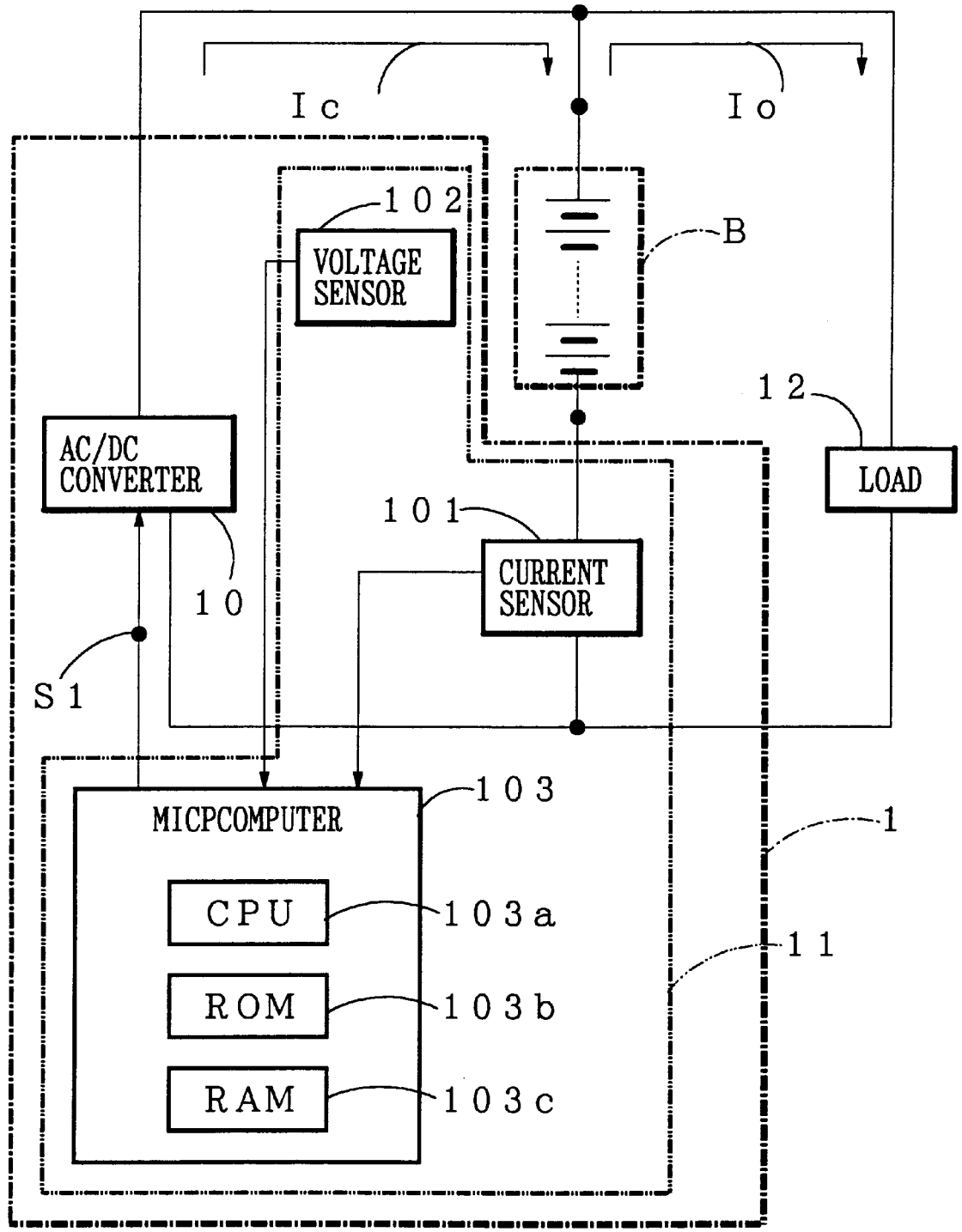
FIG. 7 is a circuit diagram showing an example of a charging/discharging circuit incorporating a conventional battery charging apparatus.

FIG. 2 is a circuit diagram of an embodiment of the charging/discharging circuit incorporating the battery charging apparatus according to the invention. In FIG. 2, like reference numerals refer to like parts in the conventional apparatus shown in FIG. 7.

In FIG. 2, a battery charging apparatus 1 includes an AC/DC converter 10 for charging an in-vehicle battery B with a predetermined voltage (hereinafter referred to as a charging voltage Vc) which is approximately equal to the voltage across the in-vehicle battery and a full-charging detecting device 11 serving as a full-charging detecting means. The full-charging detecting device 11 includes a current sensor 101 having the same function as that of the conventional charging current detecting means, a microcomputer 105 and a buzzer 106 serving as a warning generating means which indicates that the in-vehicle battery B has been fully charged.

The microcomputer 105 includes an A/D converting section (not shown) for sequentially capturing the charging current Ic detected by a current sensor 101 and converting it into a digital value of the charging current Ic, a CPU 105a which is operated in accordance with a prescribed control program, an ROM 105b which stores the control program for the CPU 105a and a prescribed full-charging level, and a RAM 105c which temporarily stores the data necessary to perform the computation in the CPU 105a. The CPU 105a acquires the internal impedance RB of the in-vehicle battery B by substituting the charging current Ic into Equation (1):

$$RB = Vc/Ic \tag{1}$$

The full-charged state (remaining capacity 100%) of the in-vehicle battery B is detected on the basis of the internal impedance thus acquired. At this time, a charging/discharging stopping signal S1 is produced which stops to supply the charging current Ic from an AC/DC converter 10. A warning signal S2 is also produced which causes a buzzer 106 to generate warning for notifying the full-charged state of the in-vehicle battery B. Thus, the degradation of the in-vehicle battery B can be prevented.

Figure 3:
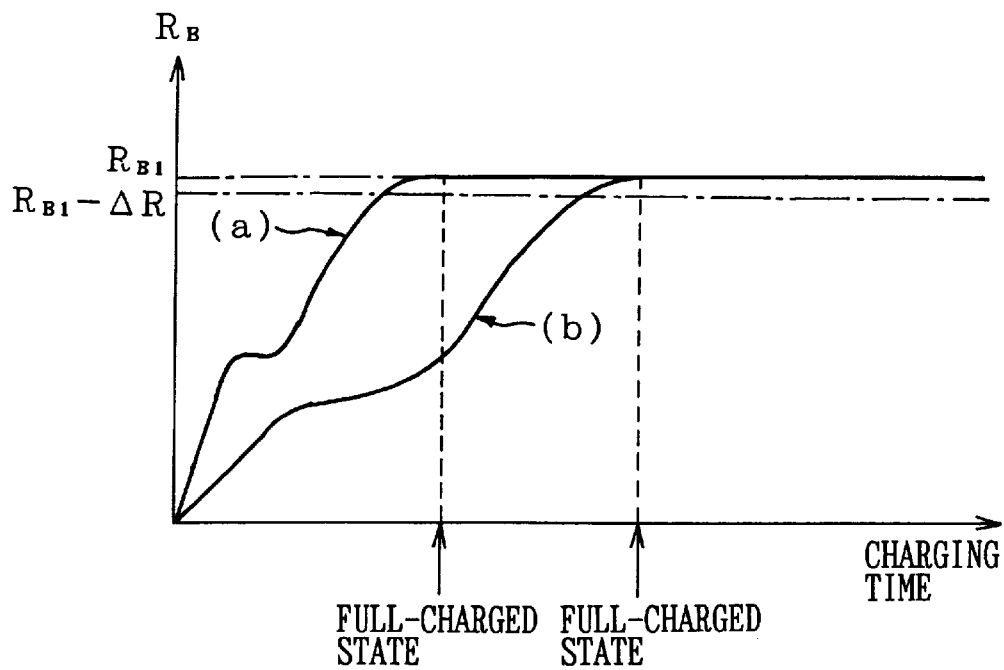
FIG. 3 is a graph showing a change in the internal impedance of an in-vehicle battery according to a charging time.

An explanation will be given of the operation of the charging/discharging circuit incorporating the battery charging device having the above configuration. Generally, when the in-vehicle battery is charged with a constant voltage, the internal impedance RB of the in-vehicle battery B has a characteristic changing with passage of time as shown in FIG. 3. In FIG. 3, curve A illustrates a change in the internal impedance RB with a charging time when a degraded in-vehicle battery B is charged with a constant voltage, and curve B illustrates a change in the internal impedance RB with a charging time when a new in-vehicle battery B is charged with a constant voltage.

As seen from the graph, first, the internal impedance RB of the in-vehicle battery B increases with passage of a time. When the in-vehicle battery B has been fully charged, the internal impedance does not further increased by charging. Namely, the internal impedance B1 when the in-vehicle battery has been fully charged does not depend on degradation of the in-vehicle battery B. Taking this fact into consideration, when the acquired internal impedance exceeds a prescribed value (RB1−ΔR) smaller than the internal impedance RB1 when the in-vehicle battery is fully charged, the CPU 105a detects the full-charged state to generate a charging stopping signal S1 for stopping supply of the charging current Ic from the AC/DC converter 10. It should be noted that the prescribed value (RB1−ΔR) is previously stored in the ROM 105b.

Figure 4:
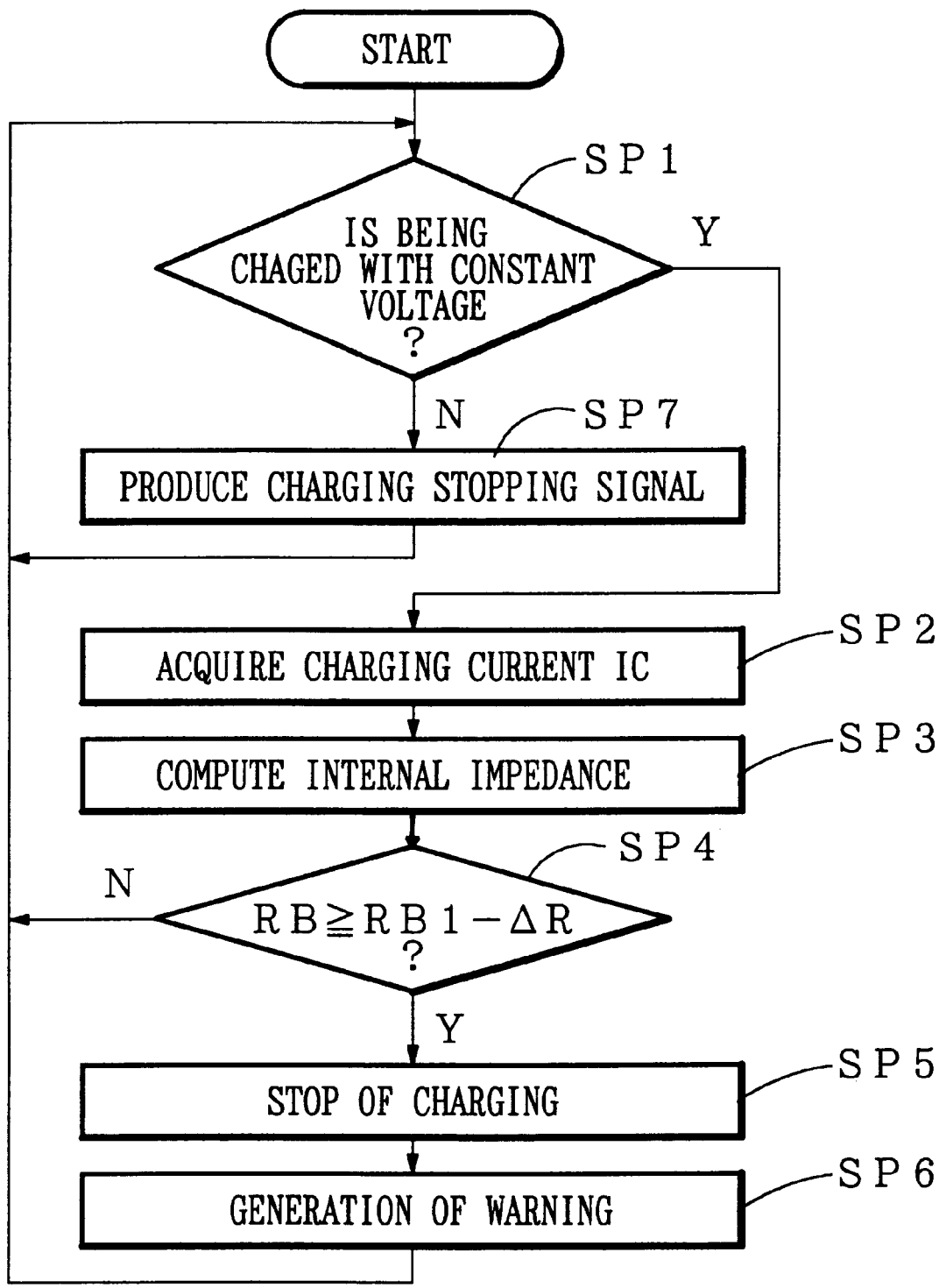
FIG. 4 is a flowchart showing a first embodiment of the procedure by an CPU constituting the charging/discharging circuit incorporating the battery charging apparatus shown in FIG. 2.

Now referring to the flowchart of the processing procedure of the CPU 105a shown in FIG. 4, a detailed explanation will be given of the operation of the charging/discharging circuit incorporating the above battery charging device.

First, the CPU 105a determines whether or not the AC/DC converter 10 is being charged with a constant voltage (Step SP1). If YES, the digital value of the charging current Ic detected by the current sensor 101 is taken from the A/D converting section (not shown) (step SP2).

The CPU 105a servers as an internal impedance computing means which computes an internal impedance RB (=Vc/Ic) from the voltage Vc and charging current Ic acquired in step SP2 (step SP3). Next, it is determined whether or not the internal impedance RB is greater than the prescribed value (RB1−ΔR) (step SP4). If YES, the CPU 105a serves as a charging stopping means. Namely, it decides that the in-vehicle battery B is in a full-charged state to supply a charging stopping signal S1 to the AC/DC converter 10 (step SP5) and supply a warning generating signal S2 to the buzzer 106 (step SP6).

When the AC/DC converter 10 receives the charging stopping signal S, it stops supply of the charging current Ic to the in-vehicle battery B to prevent excessive charging therefor. Further, when the buzzer 106 receives the warning generating signal S2, it generates warning sound indicating that the in-vehicle battery B has been fallen in the full-charged state. A user can decide from the warning sound that supply of the charging current to the in-vehicle battery B has been stopped not because the AC/DC converter 10 has suffered a breakdown but because the battery has been fallen in the full-charged state. Thereafter, the processing by the CPU 105a returns to step SP1.

On the other hand, while the in-vehicle battery B is not being charged with a constant voltage("N" in step SP1), the CPU 105a determines that the battery B is being discharged and not in the full-charged state. If the charging stopping signal S1 is being generated, the CPU 105a stops its supply (step SP7). The processing returns to step SP1.

As shown in FIG. 3, the internal impedance RB1 of the in-vehicle battery B when it is in the full-charged state does not change dependently on its degradation. Therefore, by comparing the internal impedance RB and the prescribed value (RB1−ΔR) to detect the full-charging, the full-charged state of the battery can be precisely detected even when the full-charging capacity changes dependently of the degradation of the in-vehicle battery B.

In the first embodiment, it was assumed that the in-vehicle battery is charged with the constant voltage that is equal to the voltage across the battery.

However, as the case may be, abrupt charging is performed for the in-vehicle battery B, e.g. the in-vehicle battery is charged with a constant voltage (1.3 times or more) that is sufficiently higher than the voltage across the battery B. In this case, in the state close to the full-charging, the internal impedance RB1 becomes equal to the internal impedance RB1 when the in-vehicle battery B has been fully charged and does not further vary. Therefore, the full-charging may be detected when the computed internal impedance RB is equal to the prescribed value set at the internal impedance (=RB1) when the battery has been fully charged. In this case, the full-charging can be detected in the state more close to the full-charged state, thereby surely preventing excess charging.

Meanwhile, even when the battery temperature slightly changes, the internal impedance RB1 of the in-vehicle battery B when it has been fully charged varies. Therefore, it is difficult to specify the internal impedance precisely. For example, where the actual internal impedance when the battery has been fully charged becomes lower than the prescribed value (=RB1) because of the reduction of the battery temperature, the computed internal impedance RB will not become equal to the prescribed value, thereby making it impossible to detect the full-charging.

Therefore, as described in connection with the first embodiment, the full-charging should be detected when the internal impedance RB computed by the CPU 105a exceeds (RB1−ΔR). In such a manner, as long as the internal impedance when the battery has been actually fully charged varies in a range smaller than the prescribed value (RB1−ΔR) owing to a change in the battery temperature, the full-charging state can be surely detected.

As understood from the above description, the battery charging apparatus can be suitably used in an atmosphere where the temperature is stable and hence the battery temperature does not vary so greatly.

Embodiment 2

Figure 5:
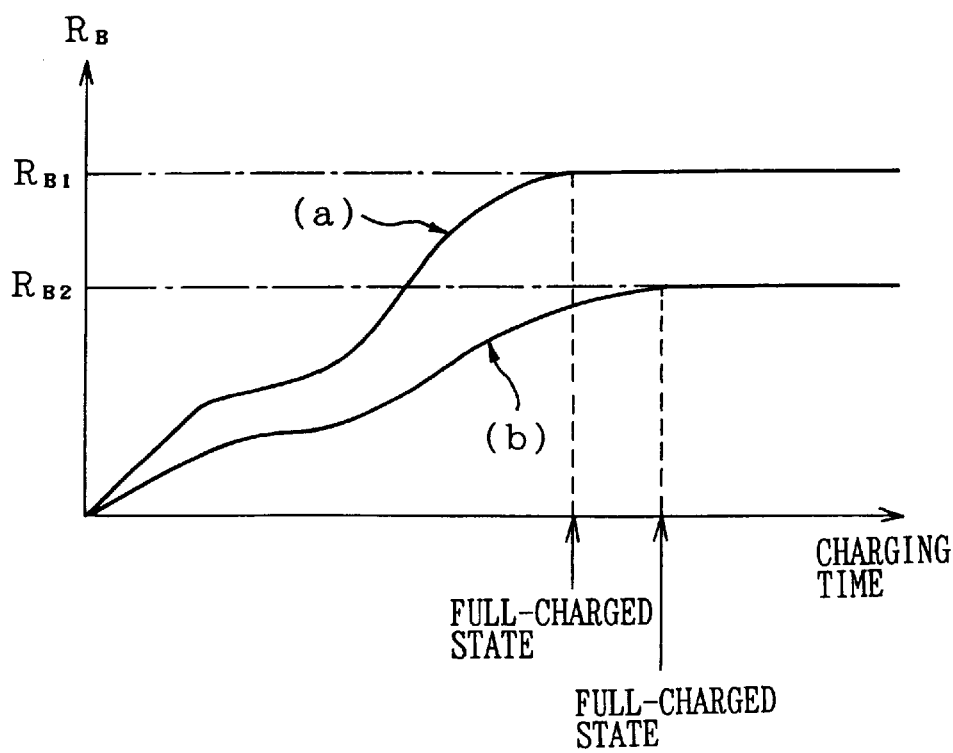
FIG. 5 is a graph showing a change in the internal impedance of an in-vehicle battery according to a charging time.

Generally, when the in-vehicle battery B is charged with a constant voltage, the internal impedance RB of the in-vehicle battery B has a characteristic depending on the battery temperature as shown in FIG. 5. In FIG. 5, curve A illustrates a change in the internal impedance RB with a charging time when the in-vehicle battery B at a normal temperature (=20° C.) is charged with a constant voltage, and curve B illustrates a change in the internal impedance RB with a charging time when the in-vehicle battery B at a low temperature (=−20° C.) is charged with a constant voltage.

As seen from the graph of FIG. 5, the internal impedance RB of the battery at the normal temperature increases in a second-order function with passage of the charging time. When the battery reaches the full-charged state (remaining capacity of 100%), a prescribed value RB1 is maintained even when the charging is continued. On the other hand, the internal impedance RB of the battery at the low temperature also increases in the second-order function with passage of the charging time. When the battery reaches the full-charged state, a prescribed value RB2 that is lower than the prescribed value RB1 is maintained. Thus, it can be understood that the internal impedance of the in-vehicle battery B when the battery has been fully charged is necessarily maintained constant irrespectively of the degradation and temperature of the battery. Therefore, in the second embodiment, as in the first embodiment, the microcomputer 105 sequentially acquires the internal impedance RB of the in-vehicle battery B. When the microcomputer 105 detects that a change ΔRB in the internal impedance thus acquired is not larger than a prescribed value and hence the internal impedance does not vary, it detects that the in-vehicle battery B has been fully charged, and issues a charging stopping signal S1 stopping supply of the charging current Ic from the AC/DC converter 10.

Figure 6:
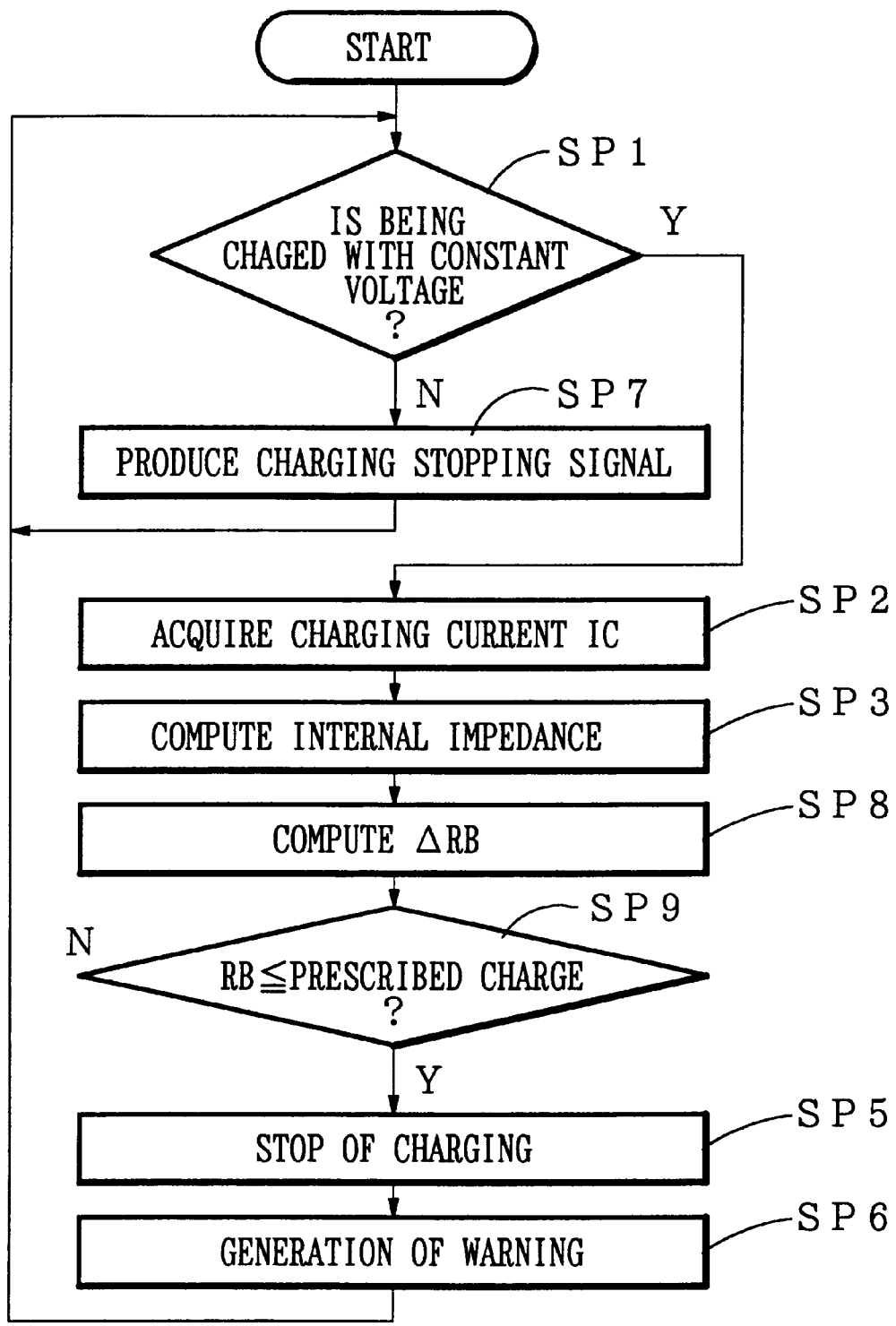
FIG. 6 is a flowchart showing a second embodiment of the procedure by an CPU constituting the charging/discharging circuit incorporating the battery charging apparatus shown in FIG. 2.

The battery charging apparatus according to the second embodiment has the same configuration as that according to the first embodiment. FIG. 6 illustrates the operation of the CPU 105a in this embodiment. Referring to the flowchart of FIG. 6, an explanation will be given of the operation of the charging/discharging circuit incorporating the battery charging apparatus according to the second embodiment. In FIG. 6, like reference symbols refer to like steps in the first embodiment. First, the CPU 105a operates in steps SP1 to SP3 in the same manner as the first embodiment. In step SP8, the CPU 105a subtracts the internal impedance RB in step SP3 acquired in step SP3 from the internal impedance RB acquired in the previous time, thereby computing the change ΔRB in the internal impedance RB (step SP8).

If the change thus computed ΔRB is not larger than the prescribed value, the CPU 105a determines that the in-vehicle battery B has been fully charged so that the internal impedance RB has become stable (Y in step SP9). The processing proceeds to step SP5. If the change ARB is larger than the prescribed value (N in step SP8), the CPU 105a determines that the in-vehicle battery is not in the full-charged state. The processing returns to step SP1.

As seen from FIG. 5, the internal impedance of the battery when it has been fully charged necessarily becomes constant irrespectively of the degradation or the temperature of the in-vehicle battery. Therefore, in this embodiment, the microcomputer 105 sequentially acquire the internal impedance RB of the in-vehicle battery B. When the microcomputer 105 detects that a change ΔRB in the internal impedance thus acquired is not larger than a prescribed value and hence the internal impedance does not vary, it detects that the in-vehicle battery B has been fully charged. Thus, even when the full-charging capacity varies owing to the degradation or temperature change of the battery, the full-charged state of the battery can be detected precisely, thereby surely preventing the excess charging.

Particularly, in the case of the in-vehicle battery B, when its degradation proceeds owing to excess charging to decrease the full-charging capacity, the battery is likely to be discharged. This interferes with the running of the vehicle. In order to obviate this difficulty, as described above, when the full-charging is detected, the supply of the charging current for the in-vehicle battery is stopped automatically. This prevents the degradation of the in-vehicle battery due to excess charging to assure the running of the vehicle.

In the first and the second embodiment, the battery charging apparatus 1 was provided for the in-vehicle battery B. However, the battery charging apparatus 1 may be provided for the other chargeable/dischargeable battery than the in-vehicle battery B to provide the same effect as described above. In this case, as long as a user can stop the supply of the charging current Ic from the AC/DC converter (DC power source) to the battery, when the full-charging of the battery is detected, it is not required to stop automatically the charging from the AC/DC converter, but only required to issue warning sound informing the user of the full-charged state. On the basis of the warning sound, the user can stop the supply of the charging current Ic to the battery, thereby preventing the degradation of the battery due to the excess charging.

Where the remaining capacity of the in-vehicle battery B is less, if the battery is charged with a constant voltage, a very large charging current flows to degrade the in-vehicle battery B. In order to obviate such inconvenience, generally, the battery charging apparatus effects the constant-current charging when the remaining capacity is less, and effects the constant-voltage charging when the remaining capacity is more. In this case, when the charging is exchanged from the constant-current charging from the constant-voltage charging with an increase in the remaining capacity, the flowchart of FIGS. 4 and 6 can be started.

What is claimed is:

1. A battery charging apparatus including full-charging detecting means for detecting a full-charged state of a battery, wherein said full-charging detecting means comprises:

charging current detecting means for detecting a charging current supplied from a DC power source while the battery is charged with a constant voltage; and internal-impedance computing means for computing an internal impedance on the basis of a charging voltage of the DC power source and said charging current detected by said charging current detecting means, wherein the internal impedance computed by said internal impedance computing means is compared with a prescribed value to detect the full-charged state.

2. A battery charging apparatus according to claim 1, wherein said prescribed value is smaller than the internal impedance when the battery has been fully charged, and said full-charging detecting means detects the full-charging when the computed internal impedance exceeds the prescribed value.

3. A battery charging apparatus according to claim 1, wherein where the battery is subjected to boost charging with a constant voltage that is higher than a voltage across the battery, said prescribed value is set at a value equal to the internal impedance of said battery, and said full-charging detecting means detects the full-charging when the computed internal impedance is equal to said prescribed value.

4. A battery charging apparatus including full-charging detecting means for detecting a full-charged state of a battery, wherein said full-charging detecting means comprises:

charging current detecting means for detecting a charging current supplied from a DC power source while the battery is charged with a constant voltage; and internal-impedance computing means for sequentially computing an internal impedance on the basis of a charging voltage of the DC power source and said charging current detected by said charging current detecting means, wherein the full-charging is detected when there is no variation on the basis of the internal impedance computed by said internal impedance computing means.

5. A battery charging apparatus according to claim 1, further comprising:

charging stopping means for stopping supply of the charging current from said battery to the battery when the full-charging is detected by said full-charging detecting means.

6. A battery charging apparatus according to claim 4, further comprising:

charging stopping means for stopping supply of the charging current from said battery to the battery when the full-charging is detected by said full-charging detecting means.

7. A battery charging apparatus according to claim 1, wherein said battery is an in-vehicle battery, said DC power source is an AC/DC converter for converting an AC current from an alternator into a DC current, and when the full-charging is detected by said full-charging detecting means, supply of the charging current from said AC/DC converting means to said in-vehicle battery is stopped.

8. A battery charging apparatus according to claim 1, wherein said battery is an in-vehicle battery, said DC power source is an AC/DC converter for converting an AC current from an alternator into a DC current, and when the full-charging is detected by said full-charging detecting means, supply of the charging current from said AC/DC converting means to said in-vehicle battery is stopped.

9. A battery charging apparatus according to claim 1, further comprising:

warning generating means for generating warning when the full-charging is detected.

10. A battery charging apparatus according to claim 4, further comprising:

warning generating means for generating warning when the full-charging is detected.

11. A method of detecting full-charging of a battery comprising the steps of:

detecting a charging current supplied from a DC power source to a battery while the battery is charged with a constant voltage;

computing an internal impedance of the battery on the basis of a charging voltage of said DC power source and said charging current; and comparing said internal impedance with a prescribed value to detect the full-charging of the battery.

12. A method of detecting full-charging of a battery comprising the steps of:

detecting a charging current supplied from a DC power source to a battery while the battery is charged with a constant voltage;

sequentially computing an internal impedance of the battery on the basis of a charging voltage of said DC power source and said charging current; and detecting the full-charging when there is no variation in said internal impedance.

* * * * *